(12) United States Patent
DeBaets

(10) Patent No.: US 8,759,690 B1
(45) Date of Patent: Jun. 24, 2014

(54) CIRCUIT FOR AND METHOD OF ROUTING SIGNALS IN A PLURALITY OF METAL LAYERS OF AN INTEGRATED CIRCUIT

(75) Inventor: Andrew J. DeBaets, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 119 days.

(21) Appl. No.: 13/369,228

(22) Filed: Feb. 8, 2012

(51) Int. Cl.
*H05K 1/11* (2006.01)
*H05K 1/02* (2006.01)

(52) U.S. Cl.
CPC .................................. *H05K 1/0219* (2013.01)
USPC ......................................................... 174/261

(58) Field of Classification Search
CPC .. H05K 1/0216; H05K 1/0219; H05K 1/0228
USPC .......................................................... 174/261
See application file for complete search history.

(56) References Cited

U.S. PATENT DOCUMENTS 7,812,426 B2 * 10/2010 Peng et al. .................... 257/621

OTHER PUBLICATIONS

U.S. Appl. No. 12/129,527, filed May 29, 2008, Paul Y. Wu et al., Xilinx, Inc., 2100 Logic Drive, San Jose, CA USA.

* cited by examiner

*Primary Examiner* — Jeremy C Norris
(74) *Attorney, Agent, or Firm* — John J. King

(57) ABSTRACT

According to an embodiment, an die for routing signals in a plurality of metal layers of an integrated circuit device is disclosed. The die comprises a first pair of conductive lines (302A and 302B) having a first reference line and a first signal line, the first reference line having traces and crossover segments in a plurality of metal layers; and second pair of conductive lines (304A and 304B) having a second reference line and a second signal line, the second reference line having traces and crossover segments in the plurality of metal layers which are offset from the traces and crossover segments of the first reference lines; wherein a first signal trace (310) of the first signal line in a first metal layer is adjacent to a first reference trace (308) of the first reference line on a first side of the first signal trace and to a second reference trace (314) of the second reference line on a second side of the first signal trace. A method for routing signals in a plurality of metal layers of an integrated circuit device is also disclosed.

20 Claims, 6 Drawing Sheets

CIRCUIT FOR AND METHOD OF ROUTING SIGNALS IN A PLURALITY OF METAL LAYERS OF AN INTEGRATED CIRCUIT

FIELD OF THE INVENTION

An embodiment relates generally to integrated circuit devices, and in particular to a circuit for and method of routing signals in a plurality of metal layers of an integrated circuit.

BACKGROUND

It is often necessary, in implementing an integrated circuit device, to route signals in the integrated circuit device, and more particularly from one or more die of the integrated circuit device to external contacts of the integrated circuit device. Signals are transmitted in an integrated circuit device on metal lines, often called metal traces, formed in metal layers separated by dielectric layers. Such metal lines may be found for example in a semiconductor die of the integrated circuit. Some integrated circuits may include multiple die which are implemented on an interposer layer which receives the multiple die. The interposer layer may enable the integrated circuit die to communicate with one another or transmit and/or receive signals from contacts of the integrated circuit package.

As integrated circuit devices continue to shrink in size, and the number of circuits for a given integrated circuit continues to increase, noise present in integrated circuits increases. Noise generated in the integrated circuit can lead to erroneous data being transmitted, for example. Such noise could lead to intermittent errors in the field, or in some cases, the failure of the integrated circuit device. In some applications, the failure of the integrated circuit device may lead to the failure of a system implementing the integrated circuit device. In order to minimize noise in circuits, various conventional techniques have been implemented. For example, the spacing between the conductive lines can be increased. However, such an increase in spacing may increase the size of the integrated circuit device. Accordingly, improved circuits and methods for routing data in an integrated circuit would be beneficial.

SUMMARY OF THE INVENTION

An die for routing signals in a plurality of metal layers of an integrated circuit device is described. The die comprises a first pair of conductive lines having a first reference line and a first signal line, the first reference line having traces and crossover segments in a plurality of metal layers; and second pair of conductive lines having a second reference line and a second signal line, the second reference line having traces and crossover segments in the plurality of metal layers which are offset from the traces and crossover segments of the first reference lines; wherein a first signal trace of the first signal line in a first metal layer is adjacent to a first reference trace of the first reference line on a first side of the first signal trace and to a second reference trace of the second reference line on a second side of the first signal trace.

According to one embodiment, the die may be an interposer. The first reference line and the second reference line may be coupled to the same reference potential. The first signal trace may be in a first metal layer of the plurality of metal layers, and the circuit may further comprise a second signal trace of the first signal line in the second metal layer, wherein the second signal trace is adjacent to a third reference trace of the first reference line on a first side of the second signal trace and to a fourth reference trace of the second reference line on a second side of the second signal trace. The die may further comprise a third signal trace in the second metal layer, wherein the third signal trace is adjacent to the third reference trace of the first reference line on a first side of the third signal trace and to a fifth reference trace of a third reference line on a second side of the third signal trace. Each of the first reference line and the first signal line may have traces located in first and second parallel lines in the first metal layer. Each of the first reference line and the first signal line may comprise traces which alternate between the first and second metal layer and between the first parallel line and the second parallel line. The first reference line and the first signal line may form a twisted pair.

According to an alternate embodiment, an die for routing signals in a plurality of metal layers of an integrated circuit device comprises a plurality of metal layers comprising a first metal layer, a second metal layer, and a third metal layer on three adjacent metal layers implementing sets of signal and reference lines, wherein the second metal layer is between the first metal layer and the third metal layer; a first signal line of a first set of signal and reference lines on a metal layer of the first, second and third metal layers; a first reference line having first reference traces adjacent to the first signal line; a second reference line having second reference traces adjacent to the first signal line; and a second set of signal and reference lines, wherein the reference traces of the second set of signal and reference lines are offset from the first reference traces and the second reference traces.

The signal line may be on the second metal layer, wherein the first reference traces and the second reference traces are in the first metal layer and the third metal layer. The signal line may be in the first metal layer, and wherein crossover segments of the first reference line are formed in the second metal layer and crossover segments of the second reference line are formed in the third metal layer. The first reference line and the second reference line may have traces located in first and second parallel lines in the first metal layer, wherein the first reference line and the second reference line have traces located in third and fourth parallel lines in the third metal layer. Each of the first and second reference lines may comprise traces which alternate between the first and third metal layers.

A method of routing signals in a plurality of metal layers in an integrated circuit device is also described. The method comprises forming a plurality of first reference traces and first crossover segments of a first reference line of a first set of signal and reference lines; forming a plurality of second reference traces and second crossover segments of a second reference line; and providing a return path for current, for each segment of a signal line, by way of a first reference signal trace of the first reference line and a second reference signal trace of the second reference line, wherein the first reference trace and the first crossover segments are offset from reference traces and crossover segments of a second set of signal and reference lines.

Providing a return path for current may comprise providing the first reference signal trace of the first reference line and the second reference signal trace of the second reference line in the first metal layer for a predetermined segment of the signal line. Providing a return current path may comprise providing a twisted pair arrangement of the signal line and the first reference line. The method may further comprise forming the signal line in a third metal layer between the first metal layer and the second metal layer. Providing a return path for current may comprise providing the first reference signal trace of the first reference line in the first metal layer and the second reference signal trace of the second reference line in the second metal layer. Providing the first reference signal trace of the first reference line in the first metal layer and the second reference signal trace of the second reference line in the second metal layer may form a twisted pair of the first reference line and the second reference line around the signal line.

DETAILED DESCRIPTION OF THE DRAWINGS

Figure 1:
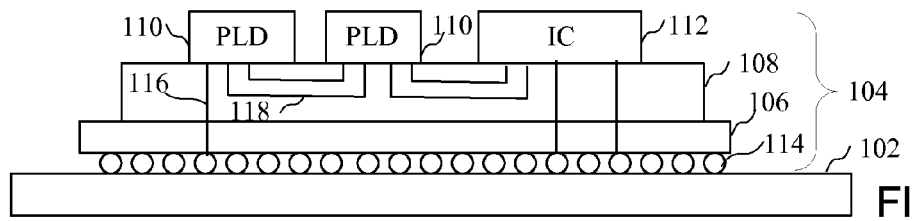
FIG. 1 is cross-sectional view of an integrated circuit device according to an embodiment.

Turning first to FIG. 1, a cross-sectional view of an integrated circuit device according to an embodiment is shown. According to the embodiment of FIG. 1, a circuit board 102, such as a printed circuit board, is configured to receive a multi-die integrated circuit device 104. The multi-die integrated circuit device 104 comprises a substrate 106 coupled to receive an interposer 108. The interposer 108 enables coupling multiple integrated circuit chips or die, such as programmable logic device (PLD) chips 110 and another integrated circuit chip 112, to one another or to the substrate 106.

A PLD is a device having programmable resources. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell. PLDs, including FPGAs and CPLDs, are available from Xilinx, Inc. of San Jose, Calif. However, it should be understood that devices having programmable resources may be implemented in any type of integrated circuit device, such as an application specific integrated circuit (ASIC) having programmable resources.

Solder balls 114 enable coupling signals from the various chips to the circuit board 102 by way of various interconnects 116, such as through silicon vias (TSVs). Interconnects 118 also enable the routing of signals between the various chips of the multi-die integrated circuit device. The interposer 108 may be a die such as a carrier die having a silicon substrate with various metal layers comprising interconnect elements enabling the routing of signals between the PLD chips 110 and the IC chip 112 or between one of the PLD chips 110 or the IC 112 and the substrate 106. However, the interposer could be any material having conductive elements which enable routing signals as shown. While all of the circuits of the PLD chips 110 and the other integrated circuit chip 112 could be implemented on a single die, the embodiment of FIG. 1 implementing PLD chips 110 and the integrated circuit chip 112 on separate die as shown enables more efficiently implementing the various circuits of PLD chips 110 and the other integrated circuit chip 112. For example, some circuits may be more efficiently implemented in an integrated circuit chip manufactured according to one process, such as a process forming transistors of a certain dimension, while other circuits may be implemented more efficiently in an integrated circuit chip manufactured according to another process.

Figure 2:
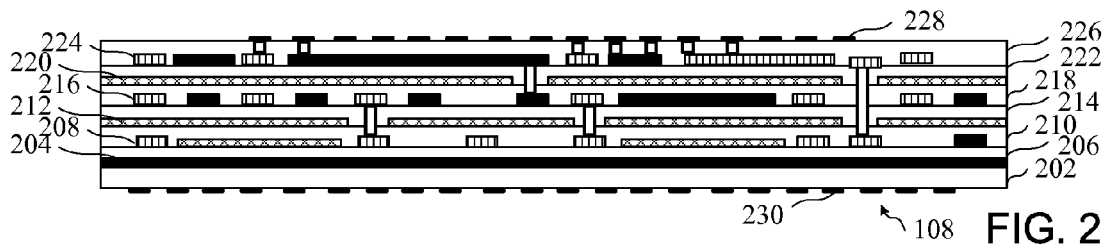
FIG. 2 is a cross-sectional view of an element of the integrated circuit device of FIG. 1 having a plurality of metal layers according to an embodiment.

Turning now to FIG. 2, a cross-sectional view of an element of the integrated circuit device having a plurality of metal layers according to an embodiment is shown. As shown in FIG. 2, metal layers having conductive traces for different signal types are provided. By way of example, a ground trace is indicated in solid black, a signal trace is indicated by cross-hatched lines, and a power voltage trace is indicted by vertical lines. In particular, a first dielectric layer 202 is provided, upon which a metal layer 204 may be formed. A dielectric layer is used to separate each of the metal layers, where a dielectric layer 206 is placed over the metal layer 204. According to the embodiment of FIG. 2, the metal layer 204 comprises a reference plane, which is a ground plane in this example.

A metal layer 208 is then applied on the dielectric layer 206. As can be seen, the metal layer 208 comprises both conductive traces for coupling input/output signals as well as a power voltage signal. After a dielectric layer 210 is applied over the conductive traces, another metal layer 212 is applied. Another dielectric layer 214 is applied over the conductive traces of the metal layer 212, upon which more conductive traces for routing power and ground signals of a metal layer 216 are provided. A dielectric layer 218 is then placed upon the conductive traces of the metal layer 216, and another ground reference plane is provided by a metal layer 220. Finally, conductive traces are provided over a dielectric layer 222, where the conductive traces of the metal layer 224 also route power and ground signals. A protective layer 226, which may be a dielectric layer, is provided over the conductive traces of the metal layer 224. Vias, such as via 227, are conductive elements implemented to couple traces in different metal layers. As will be described in more detail below in reference to the embodiments of FIGS. 3-10, the traces can be implemented in various metal layers to provide a return path and eliminate noise in a signal line.

The routing of signals in a plurality of metal layers as shown in the circuit of FIG. 2 may be implemented in the interposer 108, integrated circuit die of the PLD chips 110 and the IC chip 112, or the substrate 106. While the circuits and methods described below may be implemented in any of the interposer 108, the integrated circuit dies of the PLD chips 110 and the IC chip 112, or the substrate 106, these circuits and methods find particular application in the interposer 108. For example, contacts 228 for receiving solder bumps of the chips of FIG. 1 may be implemented on the upper dielectric layer, while contacts 230 may be implemented on the bottom of the first dielectric layer 202 for coupling the interposer 108 to the substrate 106 by way of solder bumps.

Figure 3:
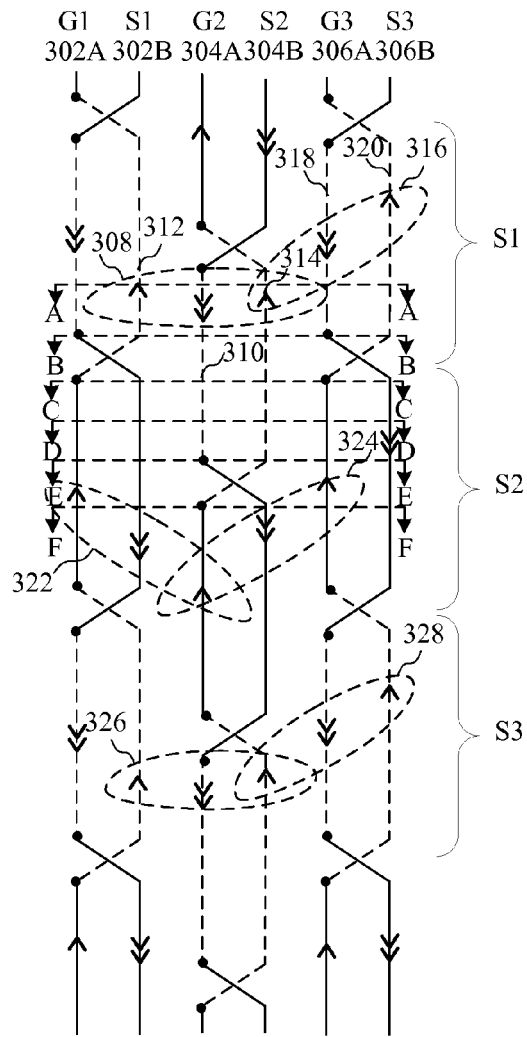
FIG. 3 is a top plan view of a portion of the element of the integrated circuit device of FIG. 2 having a plurality of metal layers according to an embodiment.

Turning now to FIG. 3, a top plan view of a portion of an element of the integrated circuit device having a plurality of metal layers according to an embodiment is shown. When conductive traces of an integrated circuit device run adjacent to one another and there is a voltage on one of the traces, there are charges on the line which induce charges on neighboring traces. That is, there are mutual capacitances between these traces, and the signal on one trace will couple to the other line through these capacitances. Further, if currents are flowing in the two traces, their mutual inductance will cause a signal in one of them couple to the other. The arrangement of traces of the various embodiments set forth below will enable coupling of undesirable noise to adjacent traces of an integrated circuit device to eliminate the noise. FIG. 3 shows traces implemented in two metal layers which could be two metal layers of the circuit of FIG. 2, for example. Pairs of signal lines and a reference line, such as a reference line coupled to a ground potential or a reference line coupled to a power voltage reference potential, such as Vcc for example, are provided. As will be described in more detail below, a signal line or a reference line may comprise a plurality of traces representing portions of a line in different metal layers, but coupled to the same signal or reference potential, respectively. The various traces for a given line in different metal layers are connected using vias. As will also be described, traces may physically extend in parallel lines, and traces for a given line may run along two parallel lines. For example, the traces of the pairs of ground potential and reference voltage lines 302A and B, 304A and B, and 306A and B are located on parallel lines extending from the trace at the top of each of the lines of the pair as shown in FIG. 3. A crossover trace extending diagonally may be used between a via at one parallel line and a trace at the other parallel line. As shown in FIG. 3, a crossover segment 307 in the second metal layer extends from a trace, also in the second metal layer, of the signal line 304b in a first parallel line to a via 309, in a second parallel line, which extends to a trace in a first metal layer.

Traces shown in solid lines in FIG. 3 are shown in a second metal layer (such as a top metal layer designated M2 in the cross-sectional views of FIGS. 4-9) and traces shown in dashed lines are in a first metal layer (such as a bottom metal layer separated from the top metal layer by a dielectric material and designated M1 in the cross-sectional views of FIGS. 4-9). The dots represent vias coupling traces in different metal layers. While the traces generally run along one of the parallel lines, crossover traces extend between a trace (located at one parallel line) and a via (located at the other parallel line) at a junction to enable traces of a given line to extend along both parallel lines. That is, a crossover trace and a via for each of the signal line and the reference line comprise a junction, where junctions provided at approximately the same locations in the pairs of signal and reference lines enable the formation of a twisted pair of lines as shown.

Two reference traces of two different reference lines are adjacent to a trace of a signal line to provide a return path for current in a signal path. By providing the two reference traces next to the signal trace, noise (such as noise from multiple switching signals) in the signal line can be eliminated. As shown in FIG. 3, the single hash mark designations in the return path traces of the reference lines offset the noise shown by the double hash marks in the signal paths, where half the current is returned in one reference line and half the current is returned in the other reference line. By coupling equally in the positive and negative direction, a net noise of zero will result. As shown for example in the group of traces 309, half of the noise in the trace 310 (indicated by the double hash marks) is coupled in a return path in the adjacent trace 312 of reference line 302A and in the adjacent trace 314 of the reference line 304A. Accordingly, any noise in the signal line may be coupled in a return path to minimize or eliminate the noise.

Adjacent pairs of signal and reference lines are offset according to the pattern shown in FIG. 3 such that the junctions of the signal and reference lines of a given pair are located approximately at the center of signal and reference traces of each of the pairs of signal and reference lines on either side of the junctions for a given pair of signal and reference lines. By offsetting the alternating pairs of signal and reference line pairs as shown, each signal trace will be adjacent to a reference trace on either side in the same metal layer which provide return paths for half of the noise generated in the signal trace. For example, as shown in segment 1 (S1) of FIG. 3, the group of traces 309 are all in the same plane (as shown by the dashed line traces 310, 312, and 314). A similar group of traces 316 is shown in segment 1 for a signal trace 318. The group of traces 316 comprises a reference trace 320 as well as the reference trace 314 for providing a return path for noise in signal trace 318. That is, the group of traces 316 shares the return trace 314 with the group of traces 308. Similar groups of traces 322 and 324 in the second metal layer are shown in segment 2 (S2), and groups 326 and 328 (which are also in the first metal layer as in segment 1) are shown in segment 3 (S3).

Figure 4:
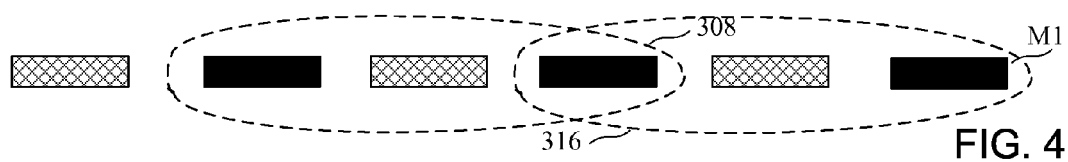
FIG. 4 is a cross-sectional view of the element of the integrated circuit device having a plurality of metal layers of FIG. 3 taken at lines A-A according to an embodiment.
Figure 5:
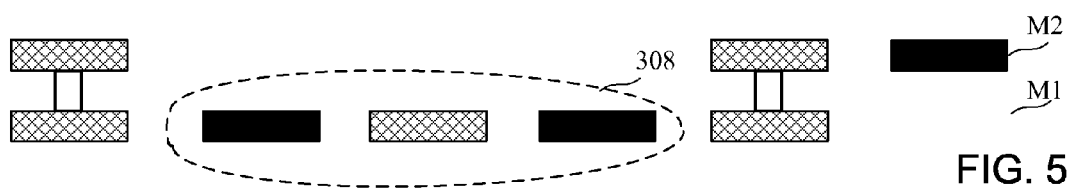
FIG. 5 is a cross-sectional view of the element of the integrated circuit device having a plurality of metal layers of FIG. 3 taken at lines B-B according to an embodiment.
Figure 6:
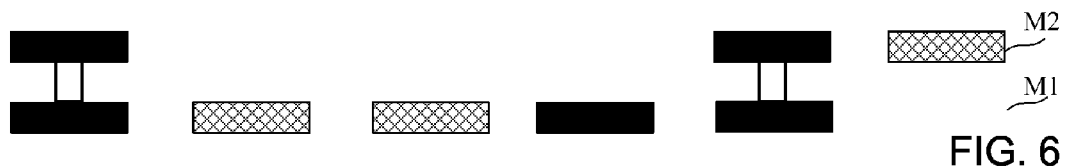
FIG. 6 is a cross-sectional view of the element of the integrated circuit device having a plurality of metal layers of FIG. 3 taken at lines C-C according to an embodiment.
Figure 7:
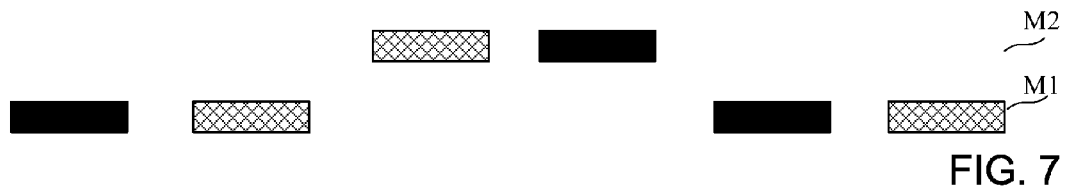
FIG. 7 is a cross-sectional view of the element of the integrated circuit device having a plurality of metal layers of FIG. 3 taken at lines D-D according to an embodiment.
Figure 8:
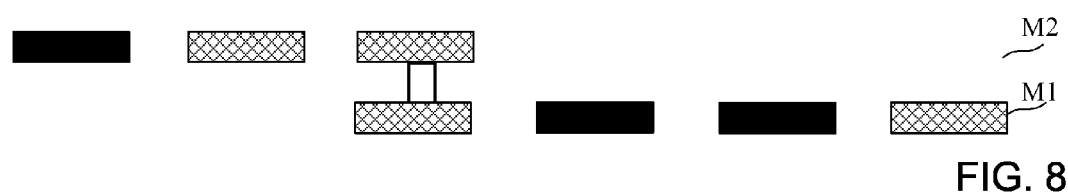
FIG. 8 is a cross-sectional view of the element of the integrated circuit device having a plurality of metal layers of FIG. 3 taken at lines E-E according to an embodiment.
Figure 9:
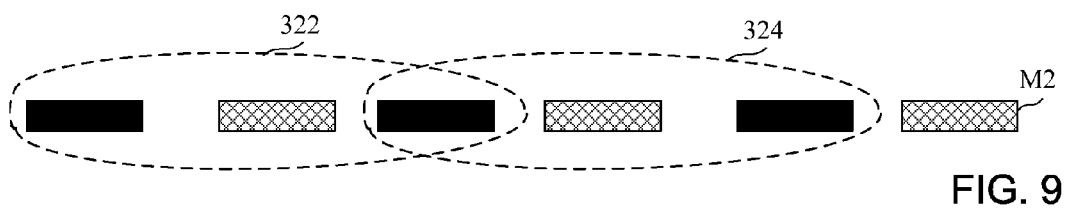
FIG. 9 is a cross-sectional view of the element of the integrated circuit device having a plurality of metal layers of FIG. 3 taken at lines F-F according to an embodiment.

Various cross sections of the element having a plurality of metal layers of FIG. 3 taken at lines A-A through F-F are shown in FIGS. 4-9, respectively. As can be seen in FIGS. 4 and 5, the groups of traces 309 and 316 are shown in the metal layer M1. The groups of traces 322 and 324 in the metal layer M2 are shown in FIG. 9.

While the embodiment of FIG. 3 shows alternating signal and ground potential reference lines, it should be understood that power voltage reference lines could be used in place of the ground potential reference lines. For example, the reference lines of FIG. 3 could comprise alternating ground potential reference lines and power voltage reference lines. Alternatively, the reference lines could be a combination of ground potential and power voltage reference lines could be used.

Figure 10:
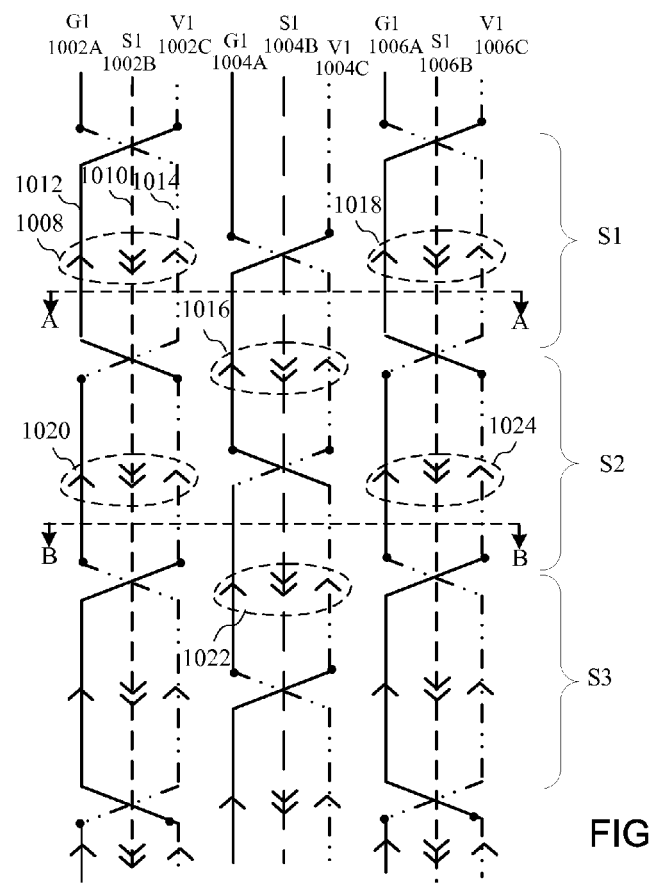
FIG. 10 is a top plan view of a portion of the element of the integrated circuit device having a plurality of metal layers according to an alternate embodiment.

Turning now to FIG. 10, a top plan view of a portion of the element of an integrated circuit device having a plurality of metal layers according to an alternate embodiment is shown. According to the embodiment of FIG. 10, three metal layers are used to provide groups of traces comprising a signal trace and two adjacent reference traces for providing a return path for noise in the signal trace. Unlike the embodiment of FIG. 3, the traces of a group (which includes reference traces for providing return paths for noise in a signal path) are found on a diagonal in three different metal layers. In order to show the arrangement of the traces in the top plan view of FIG. 10, three different designations are provided for the three different layers, with traces provided in the top layer provided in solid lines and traces in the two layers below the top layer provided in different cross hatching. Traces in the middle layer are again provided in dashed lines, while traces in the bottom metal layer are provided in a line pattern having a sequence of a dash followed by two dots. FIG. 10 comprises three sets of signal and reference lines 1002-1006, where each set of lines comprises a signal line, and two reference lines (e.g. signal line 1002A and reference lines 1002B and 1002C). According to the embodiment of FIG. 10, each set of lines comprises a signal line, a ground potential reference line and a power voltage reference line. However, it should be understood that the embodiment of FIG. 10 could be implemented with a ground potential reference line implemented for each reference line, or a power voltage reference line implemented for each reference line.

Figure 11:
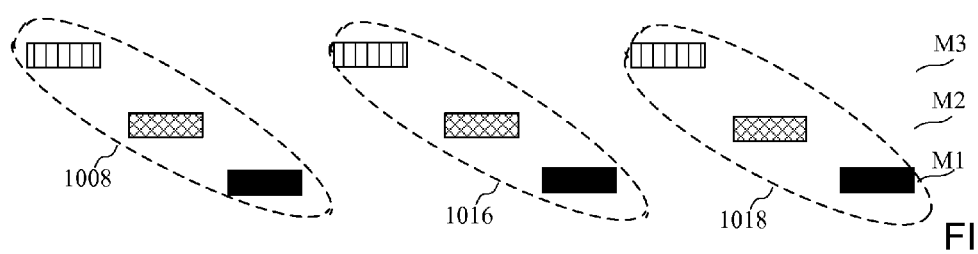
FIG. 11 is a cross-sectional view of the element of the integrated circuit device having a plurality of metal layers of FIG. 10 taken at lines A-A according to an embodiment.
Figure 12:
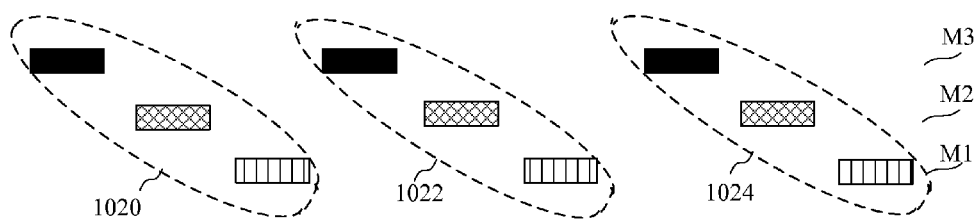
FIG. 12 is a cross-sectional view of the element of the integrated circuit device having a plurality of metal layers of FIG. 10 taken at lines B-B according to an embodiment.

In the segment 1 (S1), a set of lines 1008 comprises a signal trace 1010 which has an adjacent reference potential traces 1012 and 1014. Similar sets of traces 1016 and 1018 are shown for lines 1004 and 1006, respectively. In segment 2 (S2), three sets of traces 1020, 1022 and 1024 for the sets of signal lines are shown. However, as shown in FIGS. 11 and 12, the sets of traces 1008, 1016, 1018, 1020, 1022 and 1024 extend in a diagonal direction from the top layer M3 to the bottom layer M1. However, in either case, each signal trace has a reference trace on either side (i.e. above or below and offset) in an adjacent metal layer. Alternating sets of signal and reference lines are offset according to the pattern shown in FIG. 10 such that the junctions of the reference lines of a given set are located approximately at the center of reference traces of sets of signal and reference lines on either side of the junctions for a given set of signal and reference lines.

Figure 13:
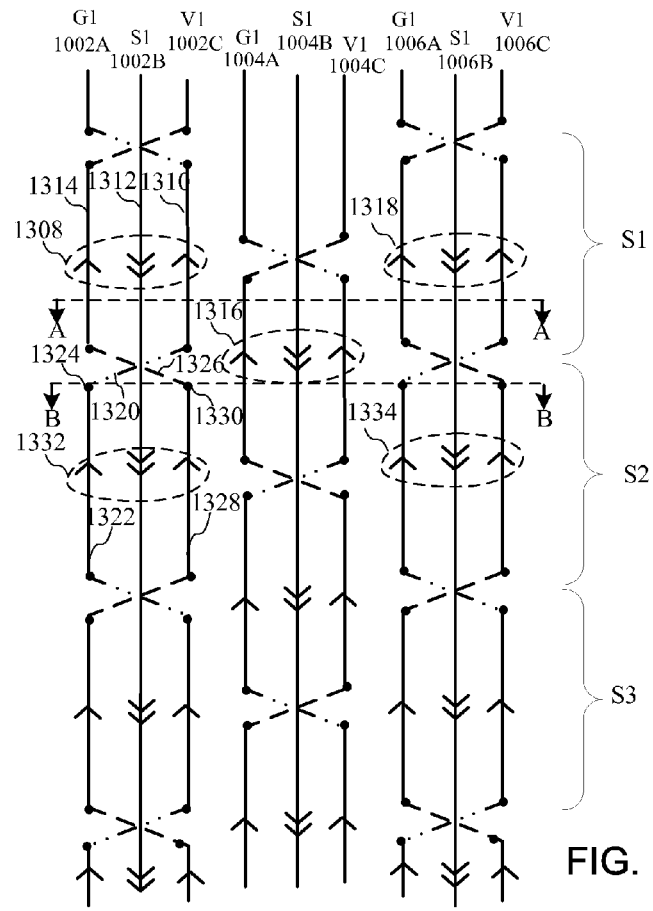
FIG. 13 is a top plan view of a portion of the element of the integrated circuit device having a plurality of metal layers according to another embodiment.
Figure 14:
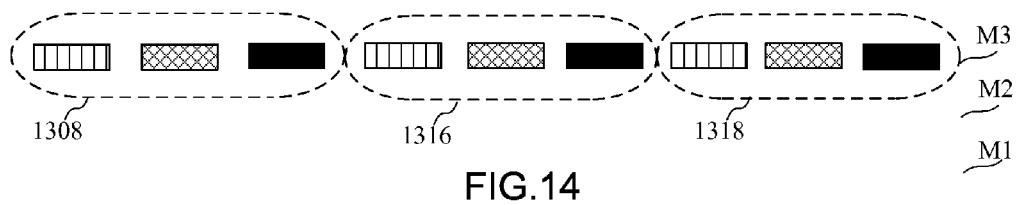
FIG. 14 is a cross-sectional view of the element of the integrated circuit device having a plurality of metal layers of FIG. 13 taken at lines A-A according to an embodiment.

Turning now to FIG. 13, a top plan view of a portion of the element of the integrated circuit device having a plurality of metal layers according to another embodiment is shown. According to the embodiment of FIG. 13, the signal traces and references traces are all in a single metal layer, and the two other metal layers are used for providing the crossover traces. In particular, a set of traces 1308 comprising traces 1310, 1312 and 1314 of a corresponding set of signal and reference lines 1002A-1002C are all on the top metal layer M3. As shown in the cross-sectional view of FIG. 14 taken at lines A-A, three sets of traces 1308, 1316 and 1318 each include a signal trace having a reference trace on either side in the same metal layer.

Figure 15:
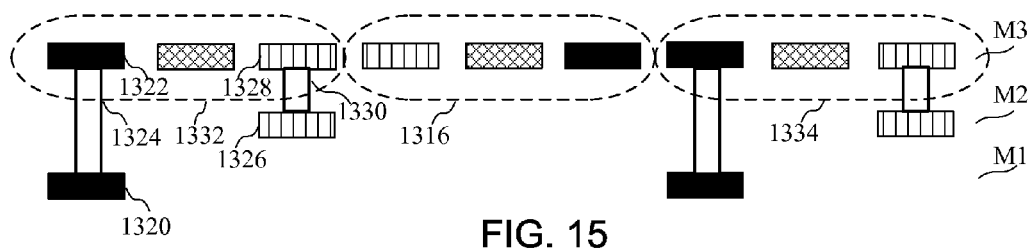
FIG. 15 is a cross-sectional view of the element of the integrated circuit device having a plurality of metal layers of FIG. 13 taken at lines B-B according to an embodiment.

As shown in the cross-sectional view of FIG. 15 taken at lines B-B of FIG. 13, the vias and cross-over traces enable reference traces of a set of traces to provide return paths for noise on a signal line of the set of traces. By way of example, a reference trace 1320 comprising a crossover trace of the reference line 1002A in the bottom metal layer M1 is coupled to a reference trace 1322 of the reference signal line 1002A in the top metal layer M3 by a via 1324 extending between the bottom metal layer M1 and the top metal layer M3. Similarly, a reference trace 1326 comprising a crossover trace of the reference line 1002C in the middle metal layer M2 is coupled to a reference trace 1328 of the reference line 1002C in the top metal layer M3 by a via 1330 extending between the middle metal layer M2 and the top metal layer M3. Accordingly, crossover traces for the reference line 1002C are provided in the middle metal layer M2, while crossover traces for the reference line 1002A are provided in the bottom metal layer M1, enabling reference traces which provide a return path for a signal trace for a set of traces to be in a single plane. Similar sets of traces 1332 and 1334 in a single plane are also shown in both FIGS. 13 and 14.

Figure 16:
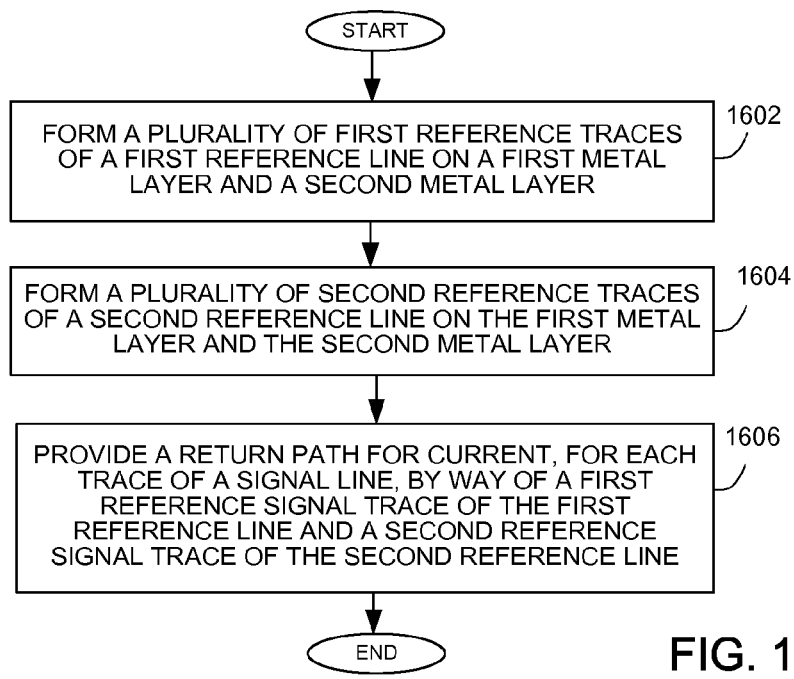
FIG. 16 is a flow chart showing a method of routing signals in a plurality of metal layers of an integrated circuit according to an embodiment.

Turning now to FIGS. 16-19, flow charts show various methods for routing signals in a plurality of metal layers of an integrated circuit. The methods set forth in the flow charts of FIGS. 16-19 may be implemented according to the circuits of FIGS. 1-15 as shown and described, or using other suitable circuits. While various elements are shown and described in the flow charts of FIGS. 16-19, it should be understood that additional details related to the various elements or additional elements which could be implemented can be found in the description of the circuits of FIGS. 1-15. The flow chart of FIG. 16 shows a method of routing signals in a plurality of metal layers of an integrated circuit according to an embodiment. A plurality of first reference traces of a first reference line is formed in a first metal layer and a second metal layer at a step 1602. A plurality of second reference traces of a second reference line is formed in the first metal layer and the second metal layer at a step 1604. A return path for current is provided, for each trace of a signal line, by way of a first reference signal trace of the first reference line and a second reference signal trace of the second reference line at a step 1606. The signal trace, the first reference trace and the second reference trace could be in the same metal layer as shown in FIG. 2, for example.

Figure 17:
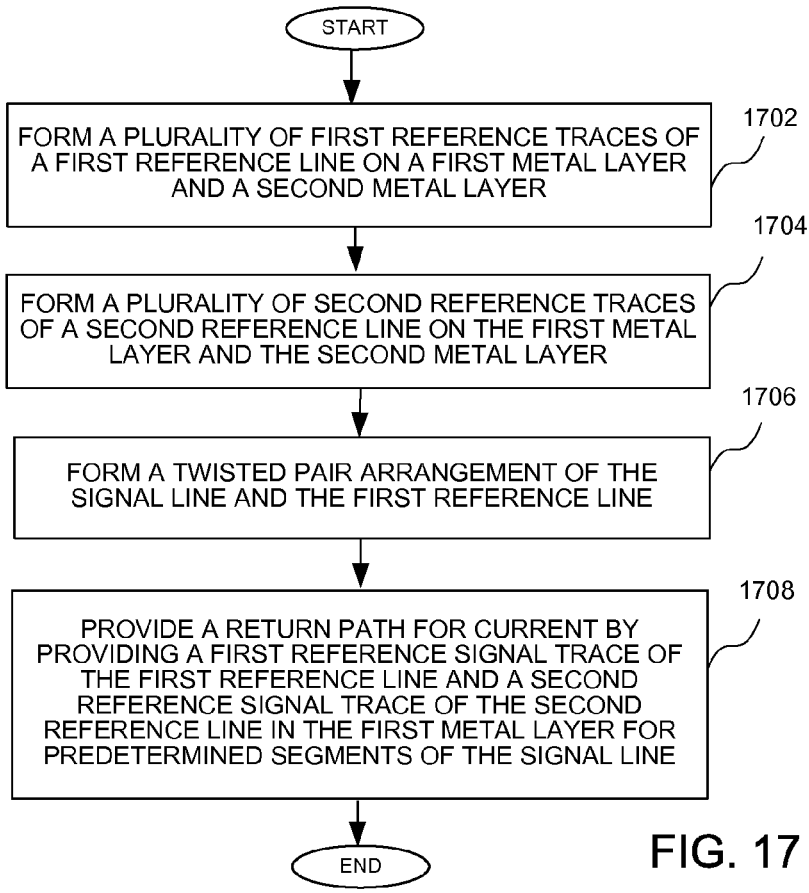
FIG. 17 is a flow chart showing a method of routing signals in a pair of metal layers of an integrated circuit according to an embodiment.

Turning now to FIG. 17, a flow chart shows a method of routing signals in a pair of metal layers of an integrated circuit according to an embodiment. A plurality of first reference traces of a first reference line are formed in a first metal layer and a second metal layer at a step 1702. A plurality of second reference traces of a second reference line are formed in the first metal layer and the second metal layer at a step 1704. A twisted pair arrangement of the signal line and the first reference line are formed at a step 1706. A return path for current is provided by providing a first reference signal trace of the first reference line and a second reference signal trace of the second reference line in the first metal layer adjacent to predetermined segment of the signal line at a step 1708.

Figure 18:
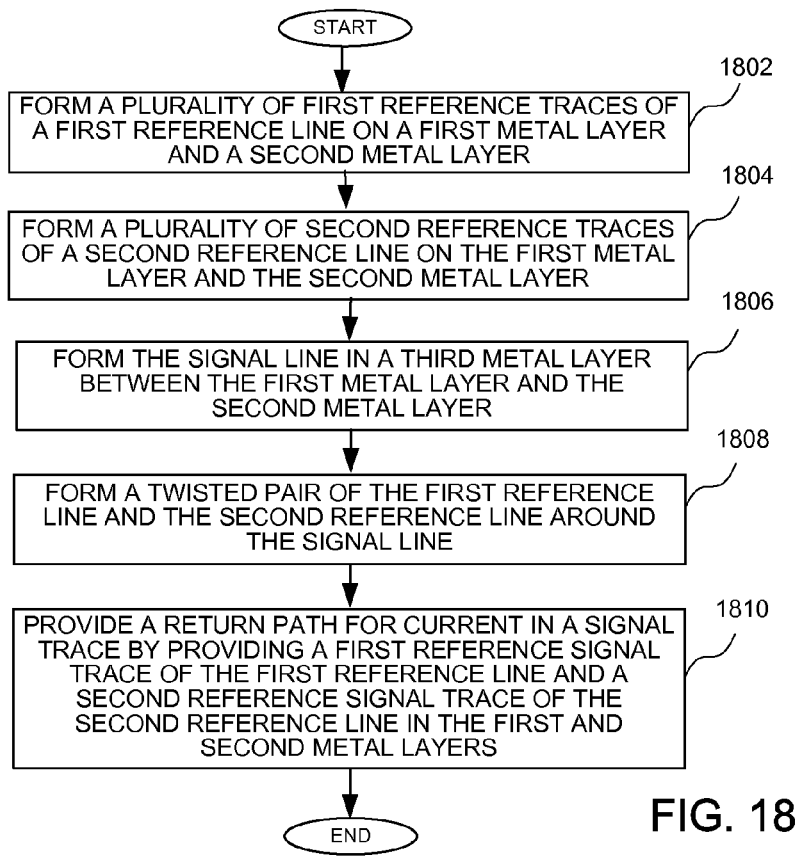
FIG. 18 is a flow chart showing a method of routing signals in three metal layers of an integrated circuit according to an alternate embodiment.

Turning now to FIG. 18, a flow chart shows a method of routing signals in three metal layers of an integrated circuit according to an alternate embodiment. A plurality of first reference traces of a first reference line is formed in a first metal layer and a second metal layer at a step 1802. A plurality of second reference traces of a second reference line is formed in the first metal layer and the second metal layer at a step

1804. The signal line is formed in a third metal layer between the first metal layer and the second metal layer at a step 1806. A twisted pair of the first reference line and the second reference line is formed around the signal line at a step 1808. A return path for current in a signal trace is provided by providing a first reference signal trace of the first reference line and a second reference signal trace of the second reference line in the first and second metal layers at a step 1810.

Figure 19:
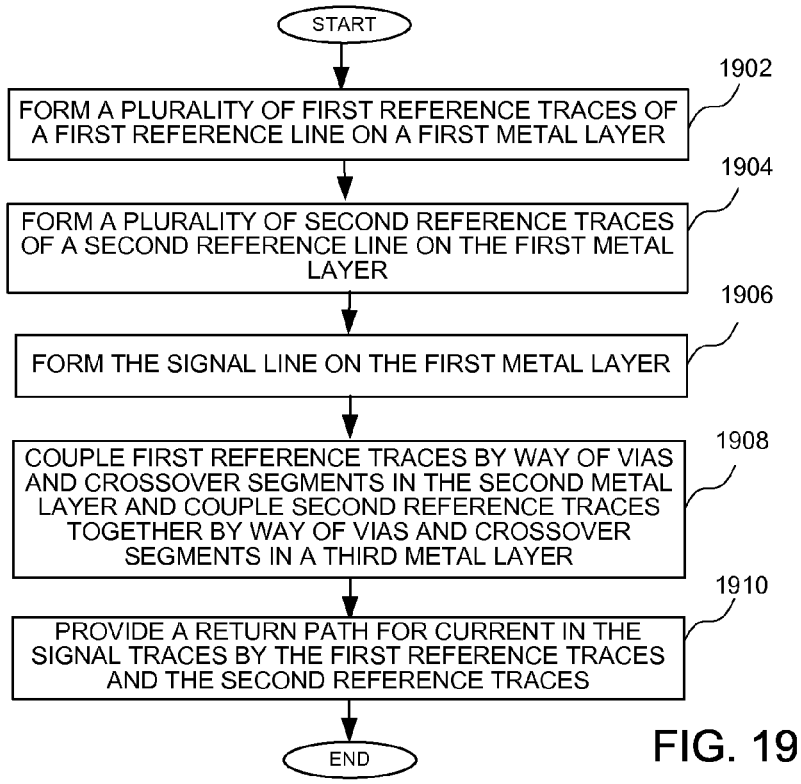
FIG. 19 is a flow chart showing a method of routing signals in three metal layers of an integrated circuit according to a further embodiment.

Turning now to FIG. 19, a flow chart shows a method of routing signals in three layers of an integrated circuit according to a further embodiment. In particular, a plurality of first reference traces of a first reference line is formed in a first metal layer at a step 1902. A plurality of second reference traces of a second reference line is formed in the first metal layer at a step 1904. The signal line is formed in the first metal layer at a step 1906. First reference traces are coupled by way of vias and crossover segments in the second metal layer, and second reference traces together are coupled by way of vias and crossover segments in a third metal layer at a step 1908. A return path is provided for current in the signal traces by traces of the first and second reference line at a step 1910.

It can therefore be appreciated that the new and novel circuit for and method of routing signals in a plurality of metal layers of an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. An die for routing signals in a plurality of metal layers of an integrated circuit device, the die comprising:
    a first pair of conductive lines having a first reference line and a first signal line, the first reference line having traces and crossover segments in a plurality of metal layers; and
    a second pair of conductive lines having a second reference line and a second signal line, the second reference line having traces and crossover segments in the plurality of metal layers which are offset from the traces and crossover segments of the first reference line;
    wherein a first signal trace of the first signal line in a first metal layer is adjacent to a first reference trace of the first reference line on a first side of the first signal trace and to a second reference trace of the second reference line on a second side of the first signal trace.

2. The die of claim 1 wherein the first reference line and the second reference line are coupled to the same reference potential.

3. The die of claim 1 wherein the first signal trace is in a first metal layer of the plurality of metal layers, the circuit further comprising a second signal trace of the first signal line in the second metal layer, wherein the second signal trace is adjacent to a third reference trace of the first reference line on a first side of the second signal trace and to a fourth reference trace of the second reference line on a second side of the second signal trace.

4. The die of claim 3 further comprising a third signal trace in the second metal layer, wherein the third signal trace is adjacent to the third reference trace of the first reference line on a first side of the third signal trace and to a fifth reference trace of a third reference line on a second side of the third signal trace.

5. The die of claim 1 wherein each of the first reference line and the first signal line have traces located in first and second parallel lines in the first metal layer.

6. The die of claim 5 wherein each of the first reference line and the first signal line comprise traces which alternate between the first and second metal layer and between the first and second parallel lines.

7. The die of claim 1 wherein the first reference line and the first signal line form a twisted pair.

8. An die for routing signals in a plurality of metal layers of an integrated circuit device, the die comprising:
    a plurality of metal layers comprising a first metal layer, a second metal layer, and a third metal layer on three adjacent metal layers implementing sets of signal and reference lines, wherein the second metal layer is between the first metal layer and the third metal layer;
    a first signal line of a first set of signal and reference lines on a metal layer of the first, second and third metal layers;
    a first reference line having first reference traces adjacent to the first signal line;
    a second reference line having second reference traces adjacent to the first signal line; and
    a second set of signal and reference lines, wherein the reference traces of the second set of signal and reference lines are offset from the first reference traces and the second reference traces.

9. The die of claim 8 wherein the signal line is on the second metal layer and wherein the first reference traces and the second reference traces are in the first metal layer and the third metal layer.

10. The die of claim 8 wherein the signal line is in the first metal layer.

11. The die of claim 10 wherein crossover segments of the first reference line are formed in the second metal layer and crossover segments of the second reference line are formed in the third metal layer.

12. The die of claim 8 wherein the first reference line and the second reference line have traces located in first and second parallel lines in the first metal layer.

13. The die of claim 12 wherein the first reference line and the second reference line have traces located in third and fourth parallel lines in the third metal layer.

14. The die of claim 8 wherein each of the first and second reference lines comprise traces which alternate between the first and third metal layers.

15. A method of routing signals in a plurality of metal layers in an integrated circuit device, the method comprising:
    forming a plurality of first reference traces and first crossover segments of a first reference line of a first set of signal and reference lines;
    forming a plurality of second reference traces and second crossover segments of a second reference line; and
    providing a return path for current, for each segment of a signal line, by way of a first reference signal trace of the first reference line and a second reference signal trace of the second reference line, wherein the first reference traces and the first crossover segments are offset from reference traces and crossover segments of a second set of signal and reference lines.

16. The method of claim 15 wherein providing a return path for current comprises providing the first reference signal trace of the first reference line and the second reference signal trace of the second reference line in the first metal layer for a predetermined segment of the signal line.

17. The method of claim 15 wherein providing a return current path comprises providing a twisted pair arrangement of the signal line and the first reference line.

18. The method of claim 15 further comprising forming the signal line in a third metal layer between the first metal layer and the second metal layer.

19. The method of claim 18 wherein providing a return path for current comprises providing the first reference signal trace of the first reference line in the first metal layer and the second reference signal trace of the second reference line in the second metal layer.

20. The method of claim 19 wherein providing the first reference signal trace of the first reference line in the first metal layer and the second reference signal trace of the second reference line in the second metal layer forms a twisted pair of the first reference line and the second reference line around the signal line.

* * * * *